United States Patent
Ward et al.

(10) Patent No.: US 8,188,601 B2
(45) Date of Patent: May 29, 2012

(54) SEMICONDUCTOR SUBASSEMBLIES WITH INTERCONNECTS AND METHODS FOR MANUFACTURING THE SAME

(75) Inventors: Terence G. Ward, Redondo Beach, CA (US); Edward P. Yankoski, Corona, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 398 days.

(21) Appl. No.: 11/758,859

(22) Filed: Jun. 6, 2007

(65) Prior Publication Data
US 2008/0303056 A1    Dec. 11, 2008

(51) Int. Cl.
*H01L 29/40*    (2006.01)

(52) U.S. Cl. .................. 257/753; 257/107; 257/706

(58) Field of Classification Search .......... 257/723, 257/107, 706, 724; 361/760
See application file for complete search history.

(56) References Cited

U.S. PATENT DOCUMENTS

| | | | |
|---|---|---|---|
| 5,492,842 A * | 2/1996 | Eytcheson et al. ............ 438/15 |
| 5,895,974 A | 4/1999 | Eytcheson et al. |
| 6,160,326 A * | 12/2000 | Iversen et al. ............ 307/147 |
| 6,906,842 B2 * | 6/2005 | Agrawal et al. ............ 359/265 |
| 7,016,192 B2 * | 3/2006 | Beihoff et al. ............ 361/689 |
| 7,187,568 B2 * | 3/2007 | Radosevich et al. ......... 363/144 |
| 7,250,920 B1 * | 7/2007 | Steinbrecher ............ 343/853 |
| 7,542,490 B2 * | 6/2009 | Miller et al. ............ 372/21 |
| 2005/0245212 A1 * | 11/2005 | Ono et al. ............ 455/127.1 |
| 2008/0101013 A1 | 5/2008 | Nelson et al. |

* cited by examiner

*Primary Examiner* — Howard Weiss
*Assistant Examiner* — Steven Rao
(74) *Attorney, Agent, or Firm* — Ingrassia Fisher & Lorenz, P.C.

(57) ABSTRACT

A semiconductor subassembly is provided for use in a switching module of an inverter circuit for a high power, alternating current motor application. The semiconductor subassembly includes a wafer having first and second opposed metallized faces; a semiconductor switching device electrically coupled to the first metallized face of the wafer and having at least one electrode region; and an interconnect bonded to the semiconductor switching device. The interconnect includes a first metal layer bonded to the at least one electrode region of the semiconductor switching device, a ceramic layer bonded to the first metal layer, the ceramic layer defining a via for accessing the first metal layer, a second metal layer bonded to the ceramic layer, and a conducting substance disposed in the via of the ceramic layer to electrically couple the first metal layer to the second metal layer.

17 Claims, 8 Drawing Sheets

SEMICONDUCTOR SUBASSEMBLIES WITH INTERCONNECTS AND METHODS FOR MANUFACTURING THE SAME

TECHNICAL FIELD

The present invention relates to interconnects for semiconductor subassemblies and methods for manufacturing the same. More particularly, the present invention relates to improved interconnects for semiconductor subassemblies such as insulated gate bipolar transistors (IGBTs) and methods for manufacturing the same.

BACKGROUND OF THE INVENTION

Insulated gate bipolar transistors (IGBTs) are semiconductor devices particularly suitable for use in power applications. IGBTs handle both high voltages and high currents with small die sizes and with relatively low "on" resistance. In addition, IGBTs can be switched rapidly, thereby making IGBTs useful as switches in three phase inverters for high power, alternating current motor applications, such as motors used to drive electric, hybrid and fuel cell vehicles. Signals are provided and received by IGBTs through interconnects to the semiconductor switching devices in the IGBTs. However, some conventional interconnects in IGBTs may have problems with reliability and stability.

Accordingly, it is desirable to provide semiconductor subassemblies having more stable and reliable interconnects. It is also desirable to provide semiconductor modules with semiconductor subassemblies having more reliable and stable interconnects. In addition, it is desirable to provide methods of manufacturing semiconductor subassemblies to provide more stable and reliable interconnects. Furthermore, other desirable features and characteristics of the present invention will become apparent from the subsequent detailed description and the appended claims, taken in conjunction with the accompanying drawings and the foregoing technical field and background.

SUMMARY OF THE INVENTION

In one exemplary embodiment, a semiconductor subassembly is provided for use in a switching module of an inverter circuit for a high power, alternating current motor application. The semiconductor subassembly includes a wafer having first and second opposed metallized faces; a semiconductor switching device electrically coupled to the first metallized face of the wafer and having at least one electrode region; and an interconnect bonded to the semiconductor switching device. The interconnect includes a first metal layer bonded to the at least one electrode region of the semiconductor switching device, a ceramic layer bonded to the first metal layer, the ceramic layer defining a via for accessing the first metal layer, a second metal layer bonded to the ceramic layer, and a conducting substance disposed in the via of the ceramic layer to electrically couple the first metal layer to the second metal layer, such that the second metal layer forms a contact pad for the at least one electrode region of the semiconductor switching device.

In another exemplary embodiment, a semiconductor module is provided for use in an inverter circuit for a high power, alternating current motor application. The semiconductor module includes a plurality of interconnected semiconductor subassemblies. Each semiconductor subassembly includes a wafer having first and second opposed metallized faces; a semiconductor switching device electrically coupled to the first metallized face, wherein the semiconductor switching device includes a gate electrode region and a emitter electrode region; and an interconnect bonded to the semiconductor switching device. The interconnect includes a first metal layer conductively bonded to the gate electrode region of the switching device, a ceramic layer bonded to the first metal layer and defining a via for accessing the first metal layer, a second metal layer bonded to the ceramic layer, and a conducting substance disposed in the via of the ceramic layer to electrically couple the first metal layer to the second metal layer such that the second metal layer forms a contact pad for the gate electrode region of the semiconductor switching device.

A method is provided for manufacturing an interconnect for a semiconductor subassembly for use in a switching module of an inverter circuit in a high power, alternating current motor application. The semiconductor subassembly includes a wafer having first and second opposed metallized faces and a semiconductor switching device electrically coupled to the first metallized face and including a gate electrode region and an emitter electrode region. The method comprising the steps of bonding a first metal layer to the gate electrode region of the switching device; bonding a ceramic layer to the first metal layer and defining a via; filling the via with a conducting substance; and bonding the second metal layer to the ceramic layer such that the conducting substance electrically couples the second metal layer to the first metal layer such that the second metal layer forms a contact pad for the gate electrode region of the semiconductor switching device.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
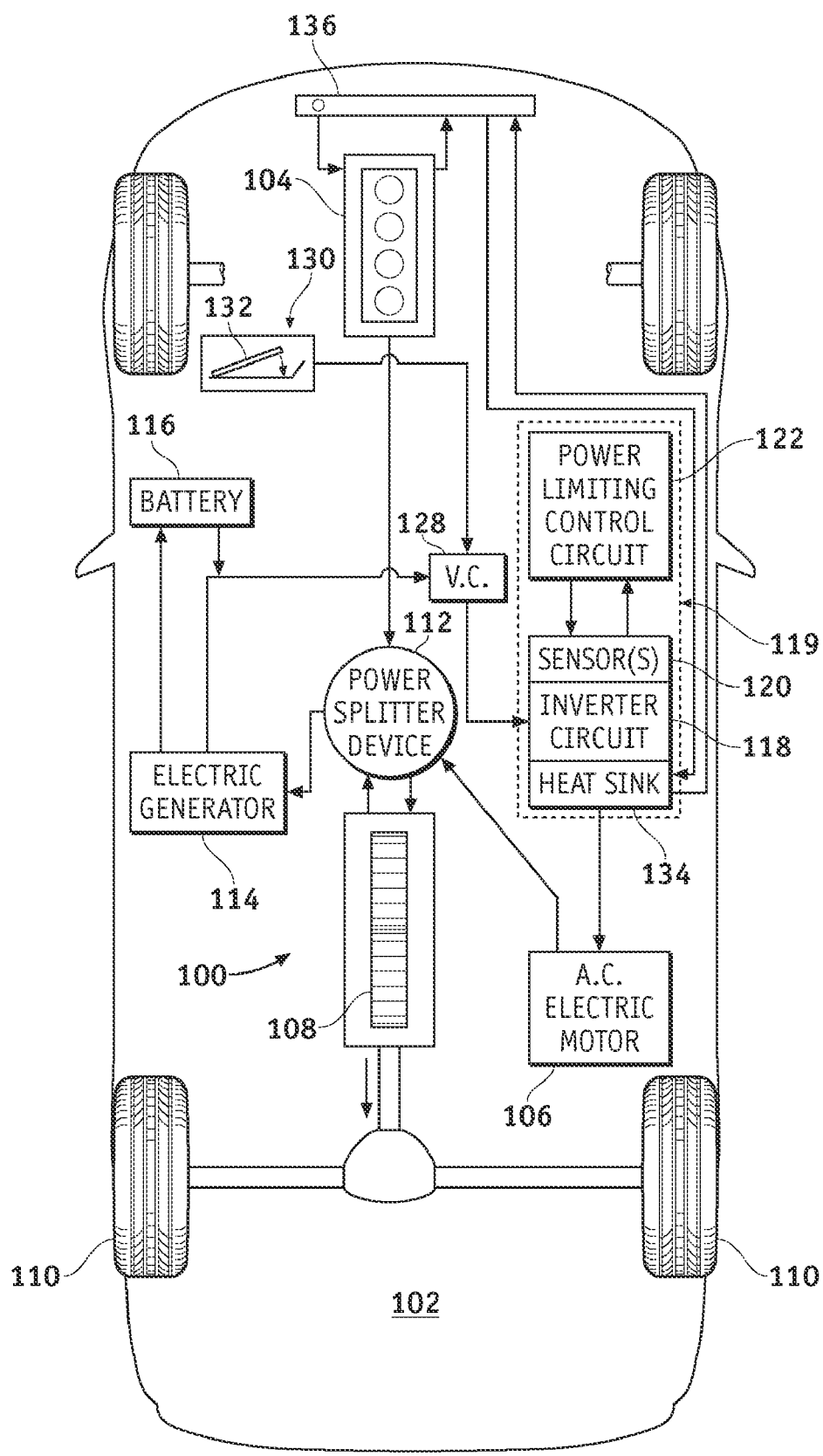
FIG. 1 is a schematic view of an automotive vehicle in accordance with an exemplary embodiment of the present invention.

FIG. 1 is an exemplary vehicle 102 with an integrated circuit (IC) engine-electric hybrid drive 100. The hybrid drive 100 includes an internal combustion engine 104 and a three-phase, alternating current (AC) electric motor 106 to drive the wheels 110 of the vehicle 102. A transmission 108 is disposed between the internal combustion engine 104 and the AC electric motor 106 for transmitting the mechanical output of the internal combustion engine 104 and the AC electric motor 106 to the wheels 110. An electric generator 114 is coupled to and provides direct current to an inverter circuit 118. The inverter circuit 118 receives the direct current from the electric generator 114 and provides alternating current to the AC electric motor 106. The electric generator 114 is also coupled to and charges a battery or bank of batteries 116. The electric generator 114 is further coupled to receive power from the internal combustion engine 104 or the AC electric motor 106. A vehicle controller 128 is disposed between the electric generator 114 and the inverter circuit 118 for controlling the current to the inverter circuit 118.

A power splitter device 112 is disposed between the internal combustion engine 104 and the AC electric motor 106 and the transmission 108, as well as between the AC electric motor 106 and the transmission 108 and the electric generator 114. The power splitter device 112 determines whether the internal combustion engine 104 or the AC electric motor 106 drives the transmission 108, and/or whether the internal combustion engine 104 or the transmission 108 drives the electric generator 114.

A speed controller 130 includes a foot pedal 132 that is coupled to the vehicle controller 128. The speed controller 130 provides a signal to the vehicle controller 128 to control the current to the inverter circuit 118 from the electric generator 114.

The inverter circuit 118 is coupled to one or more temperature sensors 120 for monitoring the temperature of the inverter circuit 118. The temperature sensors 120 are coupled to a power limiting control circuit 122. When the temperature sensors 120 detect a temperature in the inverter circuit 118 higher than a predetermined temperature, the power limiting control circuit 122 can limit the power to the inverter circuit 118 to prevent exceeding the predetermined operating temperature or reduce the temperature below the predetermined temperature. In an alternate embodiment, a switch can be provided to control current between the electric generator 114 and the inverter circuit 118.

The inverter circuit 118 is further coupled to a heat sink 134 for cooling the inverter circuit 118. The heat sink 134 can be coupled to a radiator 136 such that circulating fluid carries heat away from the heat sink 134. The heat sink 134 can also be cooled by air flowing over the heat sink 134. The vehicle 102 is merely one exemplary arrangement of an IC engine-electric hybrid drive 100. It will be appreciated by those skilled in the art that alternate IC engine-electric hybrid drive vehicles can be provided, with alternate arrangement of components, as well as additional or fewer components.

Figure 2:
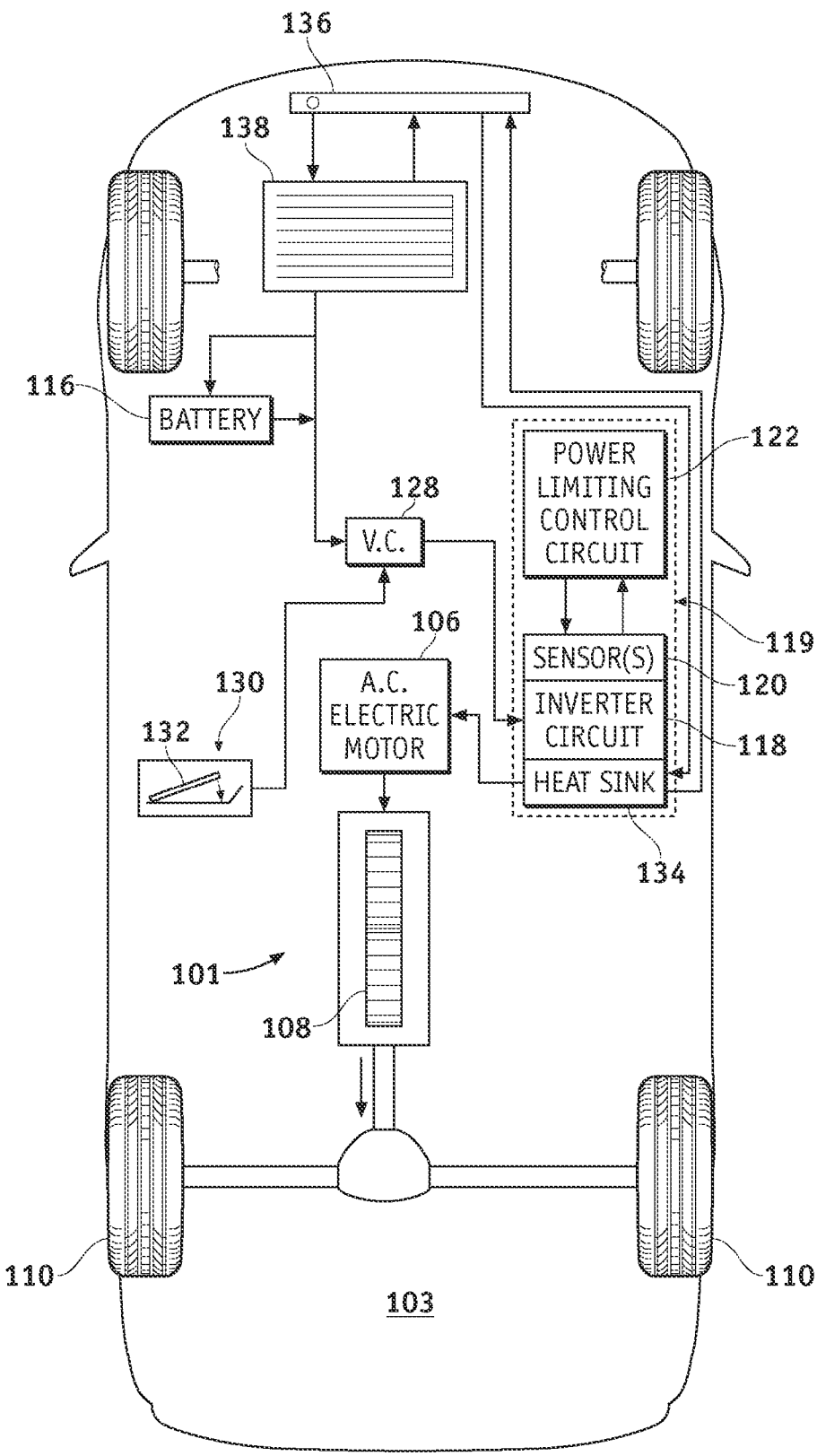
FIG. 2 is a schematic view of an automotive vehicle in accordance with another embodiment of the present invention.

FIG. 2 is a schematic view of a vehicle 103 similar to that of FIG. 1, except that the vehicle 103 includes a fuel cell drive system 101 that utilizes a fuel cell 138 to power the three-phase AC electric motor 106. As in the vehicle 102 of FIG. 1, the transmission 108 is coupled to the AC electric motor 106 for transferring the mechanical output of the AC electric motor 106 to the wheels 110. The AC electric motor 106 is also coupled to the inverter circuit 118 that supplies alternating current to the AC electric motor 106. The inverter circuit 118 is coupled to the fuel cell 138 that supplies direct current to the inverter circuit 118. The vehicle controller 128 is disposed between the fuel cell 138 and the inverter circuit 118 for controlling the current to the inverter circuit 118.

As in FIG. 1, the speed controller 130 of FIG. 2 includes the foot pedal 132 that is coupled to the vehicle controller 128. The speed controller 130 provides a signal to the vehicle controller 128 to control the current to the inverter circuit 118 from the fuel cell 138.

The inverter circuit 118 of FIG. 2 is coupled to one or more temperature sensors 120 for monitoring the temperature of the inverter circuit 118. The temperature sensors 120 are coupled to a power limiting control circuit 122. When the temperature sensors 120 detect a temperature in the inverter circuit 118 higher than a predetermined temperature, the power limiting control circuit 122 can limit the power to the inverter circuit 118 to prevent exceeding the predetermined operating temperature or reduce the temperature below the predetermined temperature. In an alternate embodiment, a switch can be provided to control current from the fuel cell 138 to the inverter circuit 118.

The vehicle 103 is merely one exemplary arrangement of an fuel cell drive system 101. It will be appreciated by those skilled in the art that alternate fuel cell drive systems can be provided, with alternate arrangement of components, as well as additional or fewer components.

Figure 3:
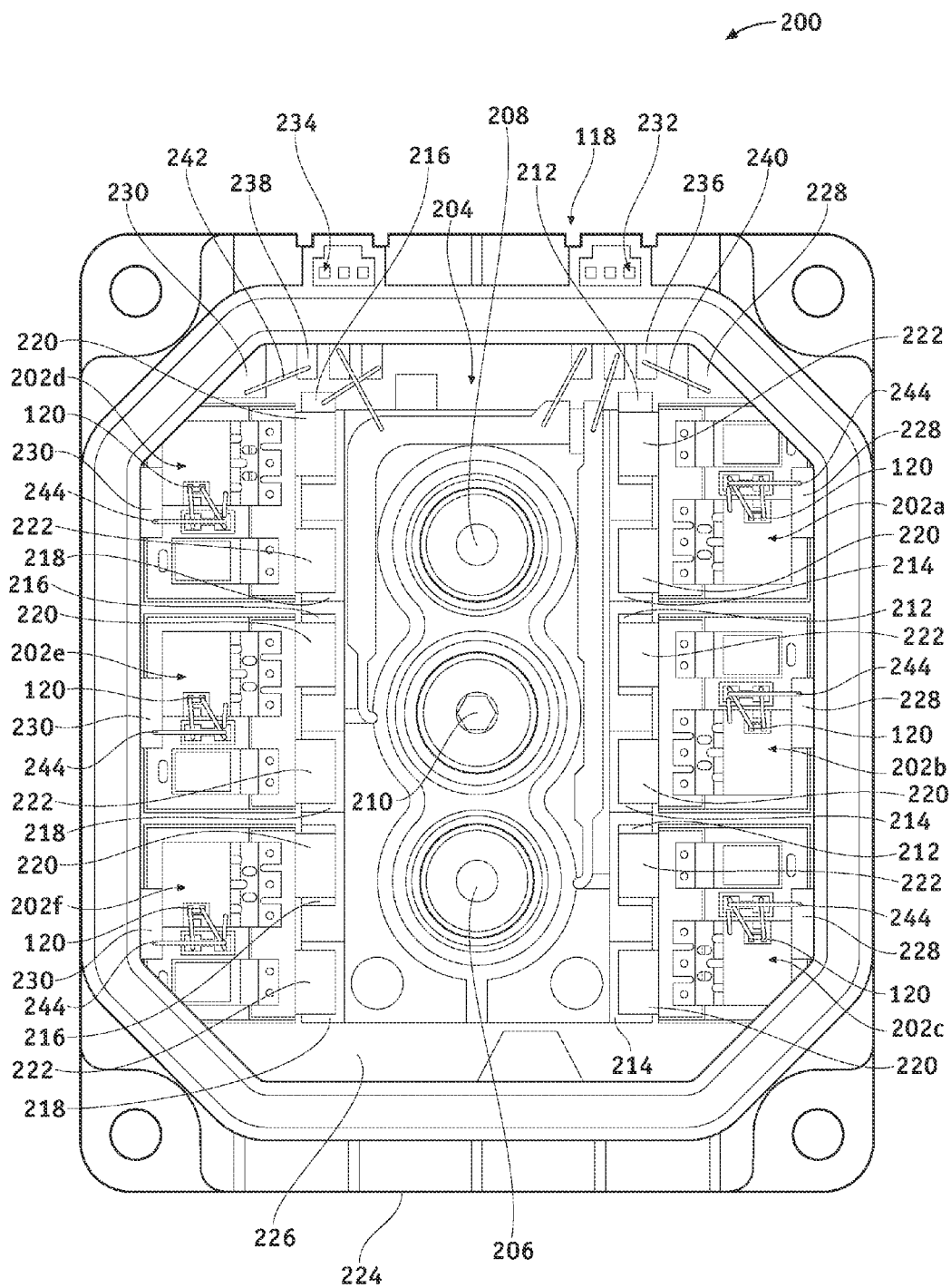
FIG. 3 is a top, plan view of an exemplary embodiment of a dual module used in an inverter circuit and a temperature sensor shown in FIGS. 1 and 2 in a switch module.

FIG. 3 is a top, plan view of an exemplary dual module inverter circuit 118 as utilized in the vehicles of FIGS. 1 and 2. The inverter circuit 118 is configured as a switch module 200 having six semiconductor subassemblies 202a-202f.

The module 200 has a terminal subassembly 204 that includes an emitter terminal 206 for the semiconductor subassemblies 202a, 202b, and 202c that form a first group, a collector terminal 208 for the semiconductor subassemblies 202d, 202e, and 202f that form a second group, and a common collector/emitter terminal 210 for both groups 202a-c and 202d-f. Terminal subassembly 204 has a first row of coplanar contacts 212 and 214 on one side, and a second row of coplanar contacts 216 and 218 on the other side. The contact rows 212, 214 and 216, 218 are parallel, as are the two groups of semiconductor subassemblies 202a-c and 202d-f. The contacts 212 are in low electrical resistance communication with emitter terminal 206 while the contacts 216 are in low electrical resistance communication with collector terminal 208. The contacts 214 and 218 are also in low electrical resistance communication with collector/emitter terminal 210. Tabs 220 of the semiconductor subassemblies 202a-202c are welded to terminal subassembly contact areas 214; tabs 222 of the semiconductor subassemblies 202a-202c are welded to terminal subassembly contact 212; tabs 220 of the semiconductor subassemblies 202d-202f are welded to terminal subassembly contact areas 216; and tabs 222 of the semiconductor subassemblies 202d-202f are welded to terminal subassembly contacts 218.

The module 200 has a housing 224 with a heat conductive baseplate 226 having a coefficient of thermal expansion close to that of the substrates in the semiconductor subassemblies 202a-202f. The cover of housing 224 is not shown to better illustrate the interior construction of the module 200. The housing 224 has two embedded lead frames 228 and 230, portions of which are exposed within the module 200 for electrical connection. The housing 224 also has two small connector areas 232 and 234 that each include two Kelvin terminals and a gate voltage terminal. The gate voltage terminal for the semiconductor subassemblies 202a-202c is indicated by reference numeral 236. The gate voltage terminal for the semiconductor subassemblies 202d-202f is indicated by reference numeral 238. Filamentary wires 240 connect the gate voltage terminal 236 to the embedded lead frame 228, while filamentary wires 242 connect the gate voltage terminal 238 to the embedded lead frame 230. Filamentary wires 244 connect the respective embedded lead frames 228 and 230 with each of the semiconductor subassemblies 202a-202f to connect it with the respective gate voltage terminal 236 and 238.

Figure 4:
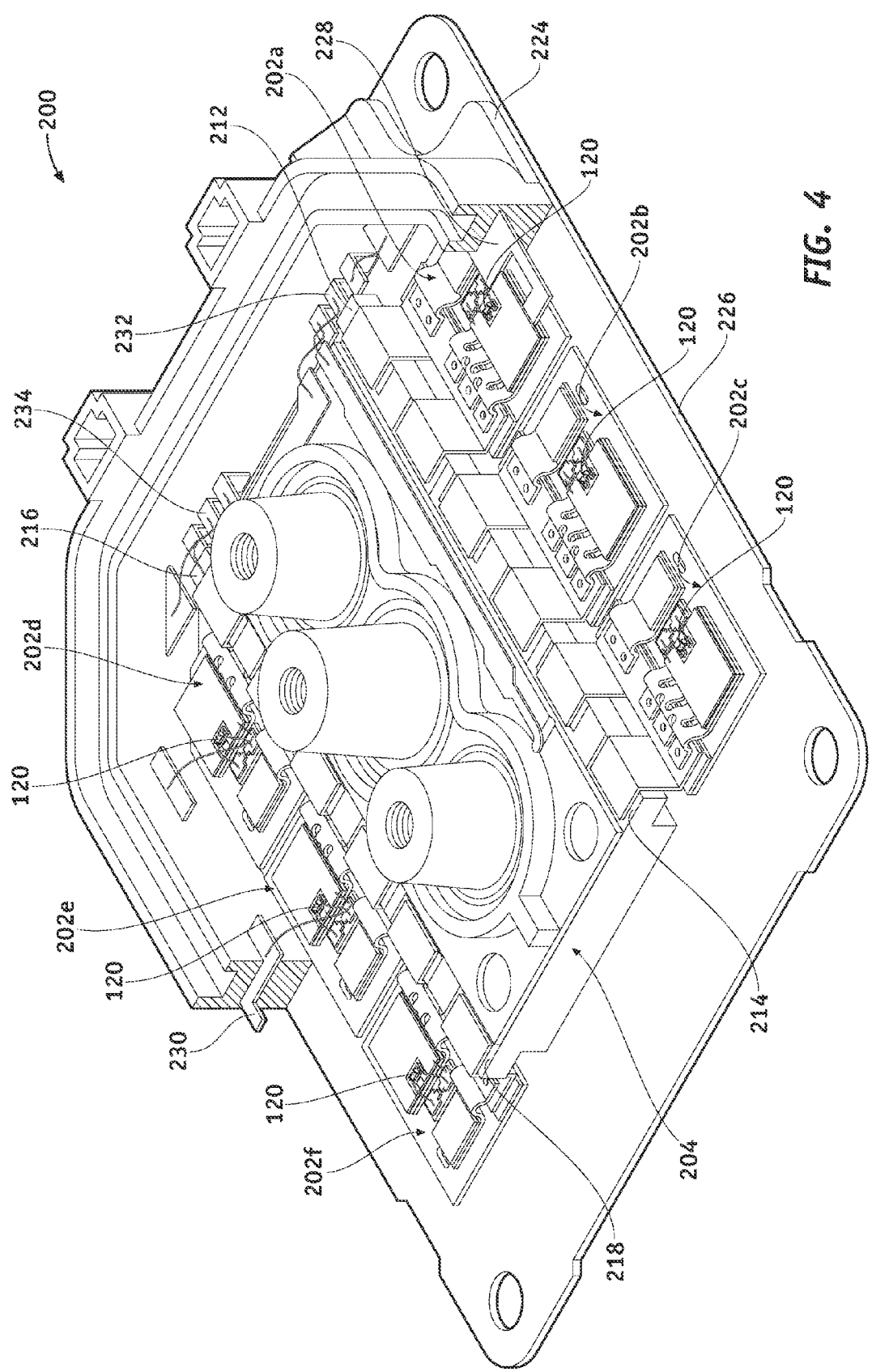
FIG. 4 is a partial isometric view of the module of FIG. 3.

FIG. 4 shows a partial isometric view of the module 200 of FIG. 3. The semiconductor subassemblies 202a-202f are shown mounted on the baseplate 226. Three semiconductor subassemblies 202a-202c are soldered to the upper surface of the baseplate 226 on one side of the terminal subassembly 204, while three semiconductor subassemblies 202d-202f are soldered to the upper surface of the baseplate 226 on the other side of terminal subassembly 204. Each group of three semiconductor subassemblies 202a-c and 202d-f is disposed along a line parallel to the centerline of terminal subassembly 204. Also, the semiconductor subassemblies 202a-f are preferably similarly, and symmetrically, disposed on the baseplate 226 to obtain uniformity in cooling, and thereby uniformity in temperature during operation. In another embodiment, the inverter circuit 118 illustrated in FIGS. 1 and 2 can be a plurality of IGBT dies and diodes mounted on a single wafer.

Figure 5:
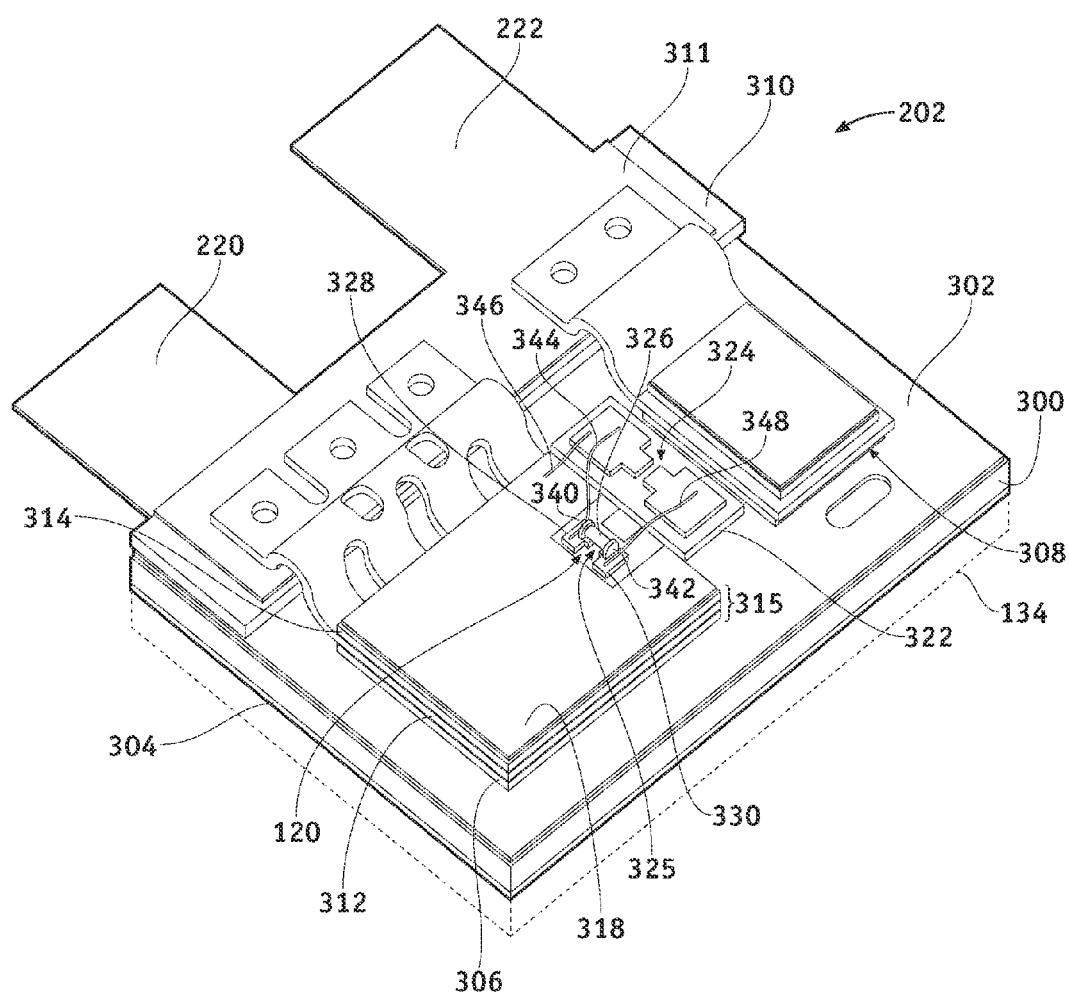
FIG. 5 is an isometric view of an exemplary embodiment of a semiconductor subassembly having a temperature sensor mounted thereon that can be used in the switch module of FIGS. 3 and 4.
Figure 6:
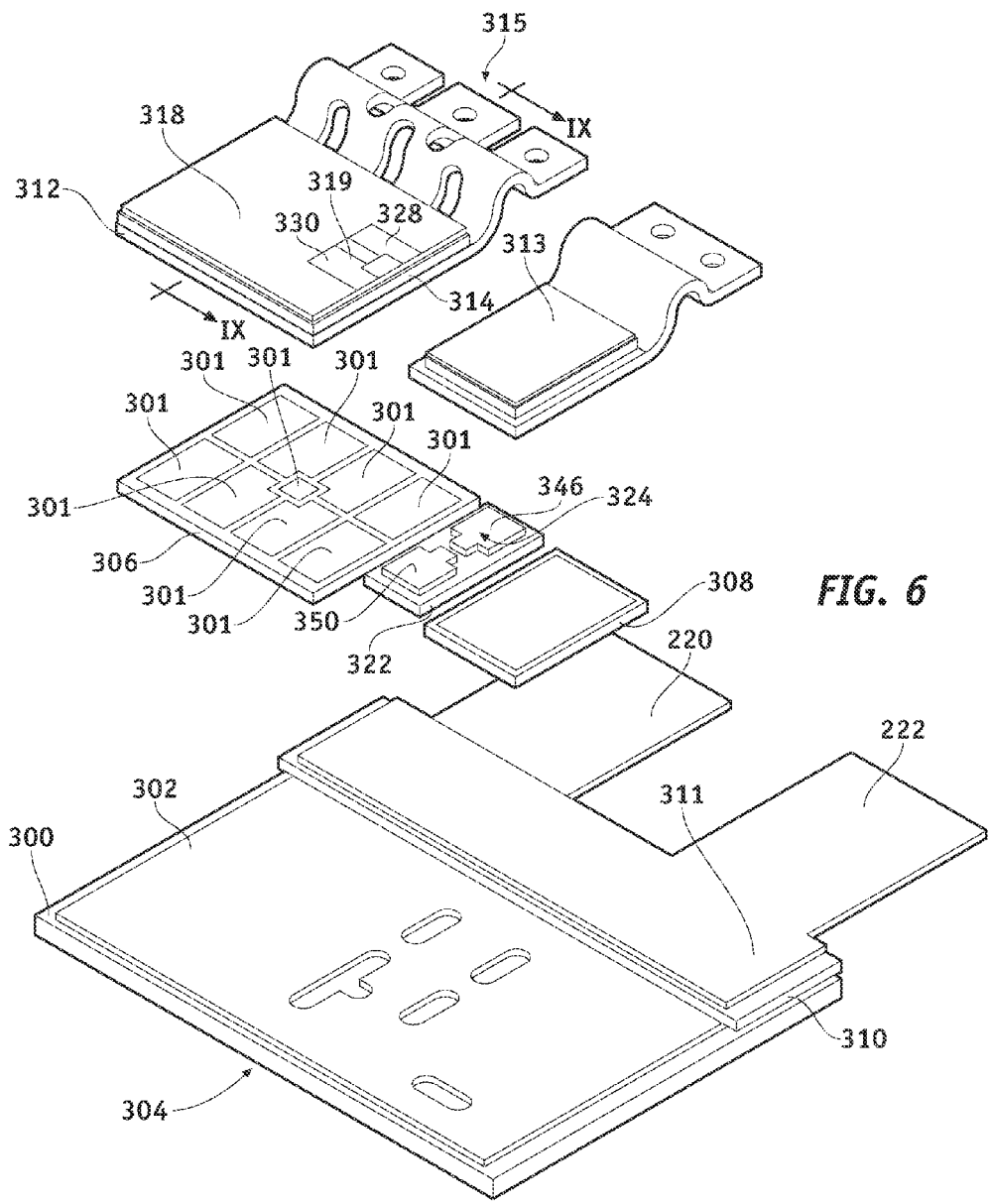
FIG. 6 is an exploded isometric view of the semiconductor subassembly of FIG. 5.

FIG. 5 shows one of the semiconductor subassemblies 202a-202f (generically referred to as 202) according to one embodiment of the invention. FIG. 6 shows the semiconductor subassembly 202 in an exploded view without the temperature sensor 120 for clarity.

In the semiconductor subassembly 202, a wafer 300 has metallized faces 302, 304 bonded to opposite sides thereto. As used herein, the terms bonded, soldered, and attached are used in their broadest sense, and in various embodiments, can be used as interchangeable processes. The wafer 300 can have a size, for example, of about 0.5-1 mm thick and about 25 mm long by about 19 mm wide, although larger and smaller sizes can be provided. The wafer 300 is made of an insulating material such as beryllium oxide, aluminum oxide, aluminum nitride, silicon nitride or boron nitride, while the metallized faces 302, 304 are copper or aluminum. The metallized faces 302, 304 may have any suitable thickness, such as, for example, a thickness of about 0.25 mm. Preferably, the metallized faces 302, 304 are directly bonded to the wafer 300. The subassembly tab 220 is a unitary portion of the metallized face 302.

A silicon semiconductor switching device 306, such as a MOSFET or a transistor of an IGBT, is bonded or adhered to a first portion of the metallized face 302 of the wafer 300, and a fast silicon semiconductor diode (SFD) 308 is bonded to a second portion of the metallized face 302 of the wafer 300. The switching device 306 has a top surface with a gate electrode region 303 and/or an emitter electrode region 301. The SFD 308 provides a blocking diode across the emitter and collector terminals 206 and 208 (FIG. 3) of the switching device 306 and is preferably made of a material substantially similar to the switching device 306. In each semiconductor subassembly 202a-202f (FIGS. 3 and 4), an SFD 308 is paired with a switching device 306 and is in close thermal proximity thereto. The SFD 308 can have an interconnect 313 that includes a ceramic layer sandwiched between two metal layers.

A second, but smaller, ceramic wafer 310 is bonded to the metallized face 302 of the wafer 300. A foil member 311 is bonded to the ceramic wafer 310 and has the second tab 222 extending therefrom. The second tab 222 is insulated from the first tab 220 by the ceramic wafer 310.

An interconnect 315 is coupled to the switching device 306. The interconnect 315 comprises a first metal layer 312, a ceramic layer 314, and a second metal layer 318. The first metal layer 312 is bonded to one side of the ceramic layer 314 and serves as a conductor to contact areas of the switching device 306. The second metal layer 318 is bonded to the other side of the ceramic layer 314, and is further connected to a trimmable resistor 322 having a contact pad 324 with a conductive lead 346. The first metal layer 312 and the second metal layer 318 can be, for example, copper or aluminum. The ceramic layer 314 can include, for example, aluminum oxide, aluminum nitride, beryllium oxide, and silicon nitride. The second metal layer 318 can be patterned with isolated pads 328 and 300 in area 319 to accommodate the temperature sensors 120 (e.g., FIG. 5). As discussed in further detail below, the second metal layer 318 can form a part of an interconnect and a contact pad for the switching device 306. In one embodiment, the first metal layer 312 and second metal layer 318 are bonded to opposite sides of the ceramic layer 316 to prevent a curling effect on either side of ceramic layer 316 due to differing coefficients of expansion. In some embodiments, the coefficients of expansion of the first metal layer 312 and the second metal layer 318 are the same. The metal layers 316 and 318, together the ceramic layer 316, has a coefficient of expansion that approximately matches the switching device 306. This may reduce stresses on the switching device 306 and increase durability. Moreover, the interconnect 315 can have a thickness that is similar to the thickness of the wafer 300 and metallized face 302 to reduce stresses on the switching device 306.

In one embodiment, the first metal layer 312 is bonded to the ceramic layer 314 by heating the first metal layer 312 to a temperature close to the melting point of the first metal layer 312 such that the first metal layer 312 is bonded to the ceramic layer. The second metal layer 318 can be bonded to ceramic layer 314 in a similar fashion.

Figure 7:
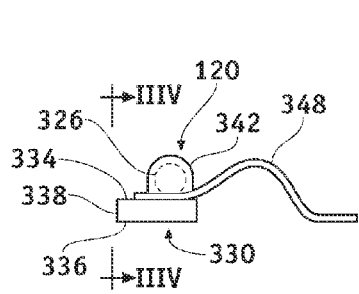
FIG. 7 is an end view of the sensor shown in FIG. 5.
Figure 8:
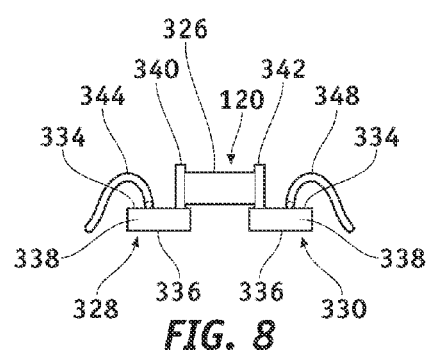
FIG. 8 is a side view of the sensor of FIG. 7 taken along plane VIII-VIII.

Referring to FIGS. 7 and 8, the temperature sensor 120 is comprised of a thermistor 326 that is soldered to the pair of pads 328 and 330 formed in the second metal layer 318. The pads 328, 330 can be formed by photomasking and etching the second metal layer 318. In an alternate embodiment, the thermistor 326 can be replaced with a thermocouple.

The thermistor 326 has a conductive flange 340 at one end soldered to the conductive surface 334 of the pad 328 and a conductive flange 342 at the other end soldered to the outer conductive surface 334 of the pad 330. A first conductive lead 344 in the form of a filamentary wire is soldered to the outer conductive surface 334 of the pad 328 and to the contact pad 324 of the trimmable resistor 322. A second conductive lead 348 in the form of a filamentary wire is soldered to the conductive surface 334 of the pad 330 and to the contact pad 324 of the trimmable resistor 322. Leads from the trimmable resistor 322 are connected to the power limiting control circuit 122 (see FIGS. 1 and 2). In an alternate embodiment, a temperature sensor (not shown) can additionally be provided for the SFD 308.

The temperature level at which current is interrupted is in the range of about 125° C. to about 175° C. and preferably about 150° C. Generally, and as an example, the maximum operating temperature of silicon is about 175°. However, due to manufacturing variability and tolerance, the power limiting control circuit 122 of one embodiment of the present invention prevents the temperature from exceeding 150°. Other embodiments may include silicon and other materials rated for higher temperatures, for example, greater than 200° C. and greater than 300° C.

Figure 9:
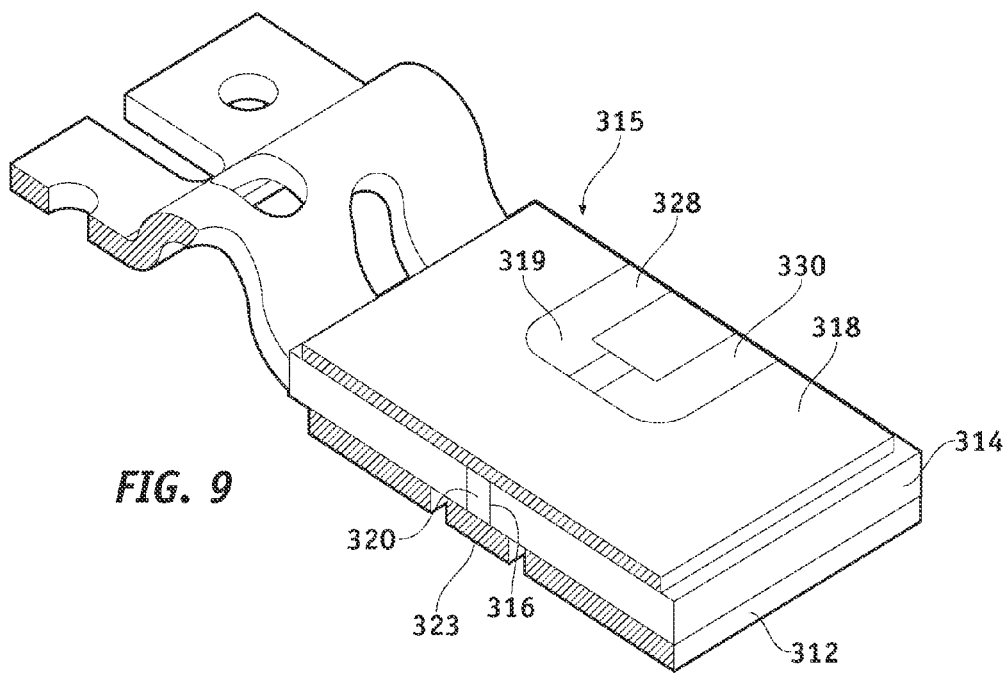
FIG. 9 is partial, cross-sectional isometric view of an exemplary interconnect for the semiconductor subassembly of FIG. 6 through plane IX-IX.

In accordance one embodiment of the invention, the temperatures of the inverter circuits 118 are sensed on one side of the inverter circuits 118, i.e., the top sides of the inverter circuits 118, and the inverters circuits 118 are cooled on the bottom sides FIG. 9 is a partial, cross-sectional isometric view of the interconnect 315 of the semiconductor subassembly 202 of FIG. 6 through plane IX-IX, in accordance with an exemplary embodiment of the present invention. The interconnect 315 includes a via 316 defined in the ceramic layer 314. The via 316 can have a diameter of about 0.2 mm to 3 mm and extend through the ceramic layer 314. The ceramic layer 314 can have a thickness of about 0.5 mm to 1 mm. The via 316 can be formed, for example, by laser drilling or punching, and in one embodiment, filled by thick film techniques. Thick film is a technique of filling the via with a slurry or paste of one or more of un-fired ceramic materials and metal powders, usually gold, and then firing the slurry or paste to create a conductive substance 320 in a via. Other embodiments may utilize polymer and metal powders that are polymerized to create the conductive material 320. The via 316 can be substantially filled with the conducting substance 320. A flat portion 321 of the second metal layer 318 can cover the via 316 and contact the conducting substance 320. The conducting substance 320 electrically connects the second metal layer 318 and the first metal layer 312. As such, the second metal layer 318 serves as a contact pad for the switching device 306. The first metal layer 312 can have a portion 323 electrically isolated from the remainder of the first metal layer 312. The electrically isolated portion 323 of the first metal layer 312 can electrically connect the second metal layer 318 to a particular part of the switching device 306, such as for example, the gate electrode region 303 (FIG. 6). In an alternate embodiment, the portion 323 can electrically connect the second metal layer 318 to the emitter electrode regions 301 (FIG. 6). The portion 323 of the first metal layer 312 can be considered part of the first metal layer 312 or can be considered part of another metal layer. The second metal layer 318 can form a larger contact pad and a more secure connection to the switching device 306 than that of the prior art. For example, the second metal layer 318 can form a contact pad for the gate electrode region 303 of the switching device 306, and provide access to the gate electrode region 303 through the ceramic layer 314. In one embodiment, the second metal layer 318 can have approximately the same area as the ceramic layer 314. In an exemplary embodiment, the thickness of the ceramic layer 314 is about 0.5 to 1 mm. The first metal layer 312, ceramic layer 314, and second metal layer 318 each have substantially matched coefficients of thermal expansion to the switching device 306 so as to reduce stresses. Moreover, the conductive material 320 can have a coefficient of thermal expansion similar to the ceramic layer 314.

Figure 10:
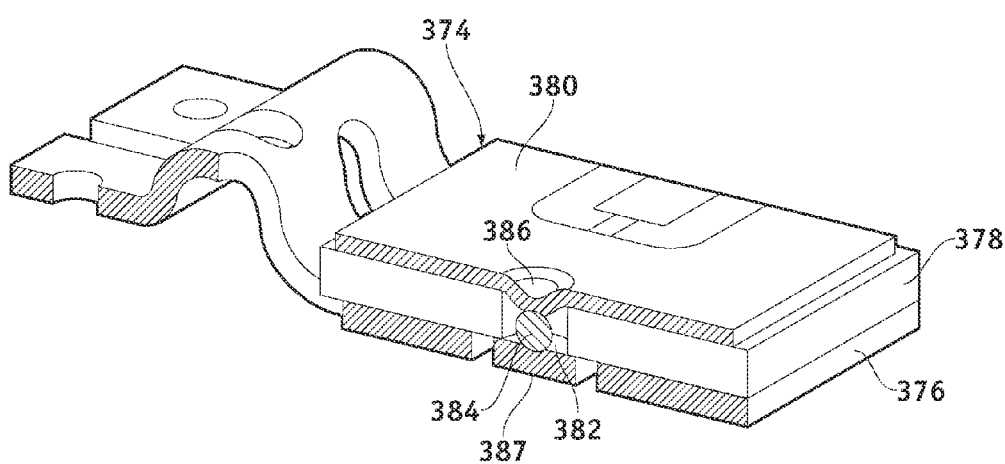
FIG. 10 is a partial, cross-sectional isometric view of another exemplary embodiment of the semiconductor subassembly of FIG. 6 through plane IX-IX.

FIG. 10 is a partial, cross-sectional isometric view of an alternate embodiment of an interconnect 374 for the semiconductor subassembly 202 of, for example, FIG. 5. As in the embodiment in FIG. 9, the interconnect 374 comprises a first metal layer 376, a ceramic layer 378, and a second metal layer 380. The first and second metal layers 376 and 380 are bonded to opposing sides of the ceramic layer 378. The first metal layer 376 is additionally bonded to the switching device 306 (e.g., FIG. 6). The first metal layer 376 can have a portion 387 electrically isolated from the remainder of the first metal layer 376. The portion 387 of the first metal layer 312 can electrically connect to a particular part of the switching device 306, such as for example, the gate electrode region 303 (FIG. 6). In an alternate embodiment, the portion 387 can electrically connect to the emitter electrode regions 301 (FIG. 6). The portion 387 of the first metal layer 376 can be considered part of the first metal layer 376 or can be considered part of another metal layer. The ceramic layer 378 defines a via 382. In this embodiment, a spherical conductor 384 is provided in the via 382. The via 382 can have a width of, for example, 1-2 mm, and the spherical conductor 384 can have a diameter of, for example, 1-2 mm. The second metal layer 380 can have a depression 386 that forms a connection between the second metal layer 380 and the spherical conductor 384, and thus, between the second metal layer 380 and at least the portion 387 of the first metal layer 376 coupled to the switching device 306.

Figure 11:
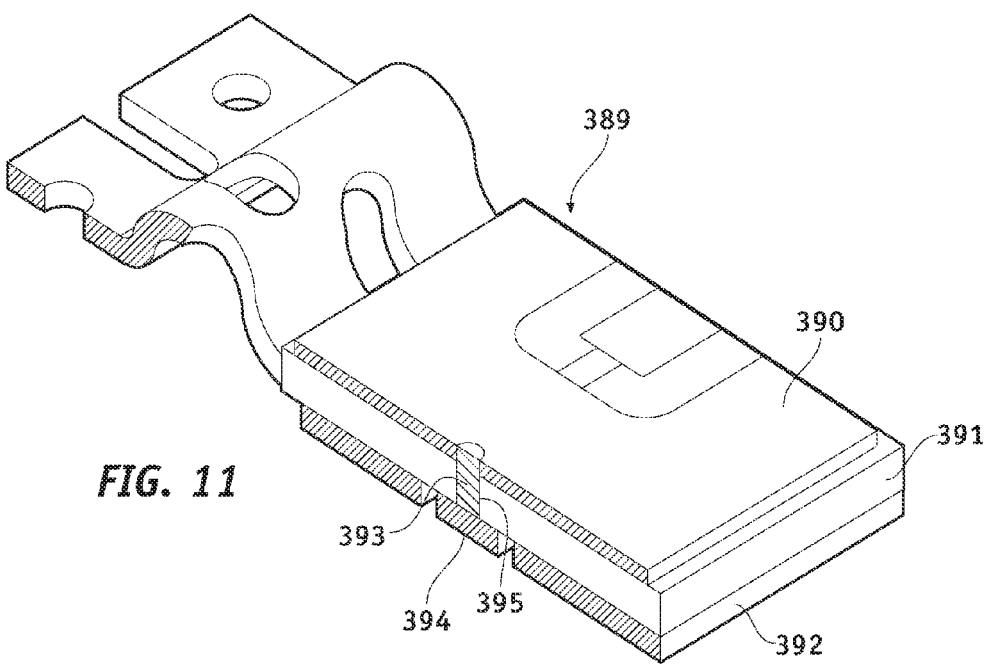
FIG. 11 is partial, cross-sectional isometric view of an additional exemplary interconnect for the semiconductor subassembly of FIG. 6 through plane IX-IX.

FIG. 11 is a partial, cross-sectional isometric view of an alternate embodiment of an interconnect 389 for the semiconductor subassembly 202 of, for example, FIG. 5. The interconnect 389 comprises a first metal layer 392, a ceramic layer 391, and a second metal layer 390. The first and second metal layers 392 and 390 are bonded to opposing sides of the ceramic layer 391. The first metal layer 392 is additionally bonded to the switching device 306 (e.g., FIG. 6). The first metal layer 392 can have a portion 394 electrically isolated from the remainder of the first metal layer 392. The portion 394 of the first metal layer 392 can electrically connect to a particular part of the switching device 306, such as for example, the gate electrode region 303 (FIG. 6). The portion 394 of the first metal layer 392 can be considered part of the first metal layer 392 or can be considered part of another metal layer. The ceramic layer 391 defines a via 395. The via 395 can have a diameter of, for example, 0.1 to 0.25 mm, although the via can be larger or smaller. In this embodiment, a conducting substance 393 is provided in the via 395. In one embodiment, the conducting substance 393 can be silver and can be injected into the via 395. The second metal layer 390 can contact the conducting substance 393 to electrically connect the second metal layer 390 to the switching device 306 (FIG. 6).

Figure 12:
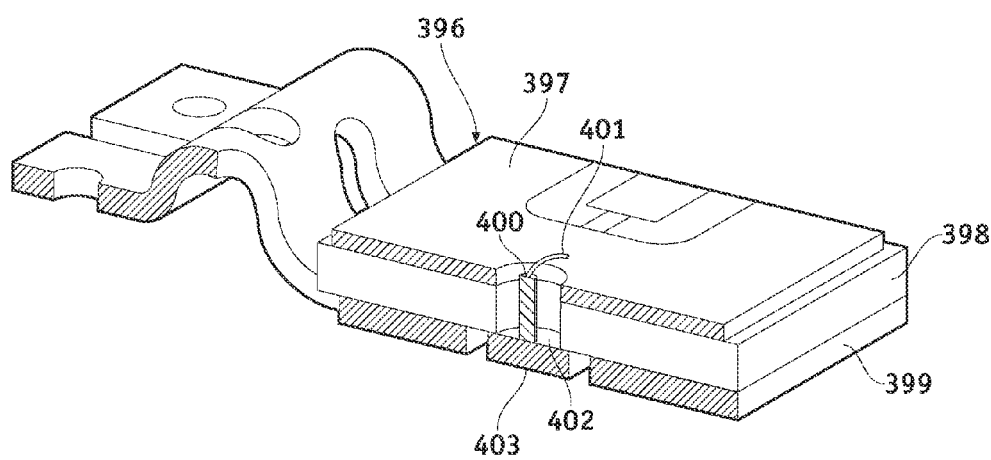
FIG. 12 is a partial, cross-sectional isometric view of another exemplary embodiment of the semiconductor subassembly of FIG. 6 through plane IX-IX.

FIG. 12 is a partial, cross-sectional isometric view of an alternate embodiment of an interconnect 396 for the semiconductor subassembly 202 of, for example, FIG. 5. The interconnect 396 comprises a first metal layer 399, a ceramic layer 398, and a second metal layer 397. The first and second metal layers 399 and 397 are bonded to opposing sides of the ceramic layer 398. The first metal layer 399 is additionally bonded to the switching device 306 (e.g., FIG. 6). The first metal layer 399 can have a portion 403 electrically isolated from the remainder of the first metal layer 399. The portion 403 of the first metal layer 399 can electrically connect to a particular part of the switching device 306, such as for example, the gate electrode region 303 (FIG. 6). The portion 403 of the first metal layer 399 can be considered part of the first metal layer 399 or can be considered part of another metal layer. The ceramic layer 398 defines a via 402. In this embodiment, a cylindrical conductor 400 is provided in the via 402. In one embodiment, the cylindrical conductor 400 is dropped into the via 402. A wire 401 can connect the cylindrical conductor 400 to the second metal layer 397, to thus connect the second metal layer 397 to the switching device 306 (FIG. 6).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor subassembly for use in a switching module of an inverter circuit for a high power, alternating current motor application, the semiconductor subassembly comprising:
a wafer having first and second opposed metallized faces;
a semiconductor switching device electrically coupled to the first metallized face of the wafer and having at least one electrode region; and
an interconnect bonded to the semiconductor switching device, and including
a first metal layer bonded to the at least one electrode region of the semiconductor switching device,
a ceramic layer bonded to the first metal layer, the ceramic layer defining a via for accessing the first metal layer,
a second metal layer bonded to the ceramic layer, and
a conducting substance disposed in the via of the ceramic layer to electrically couple the first metal layer to the second metal layer, such that the second metal layer forms a contact pad for the at least one electrode region of the semiconductor switching device, wherein the conducting substance is substantially spherical.

2. The semiconductor subassembly of claim 1, wherein the at least one electrode region is a gate electrode region.

3. The semiconductor subassembly of claim 1, wherein the second metal layer completely covers the conducting substance and the via.

4. The semiconductor subassembly of claim 1, wherein the second metal layer includes a portion that covers the spherical conducting substance and the via, the portion being depressed to contact the spherical conducting substance.

5. The semiconductor subassembly of claim 1, wherein the ceramic layer has a first surface that defines a first area and the second metal layer has a first surface that defines a second area, the first area being approximately equal to the second area.

6. The semiconductor subassembly of claim 1, wherein the semiconductor switching device is an IGBT.

7. The semiconductor subassembly of claim 1, wherein the conducting substance is silver.

8. The semiconductor subassembly of claim 1, wherein the conducting substance is thick film.

9. The semiconductor subassembly of claim 1, further comprising a wire to electrically connect the conducting substance with the second metal layer.

10. A semiconductor module for use in an inverter circuit for a high power, alternating current motor application, the semiconductor module comprising:
a plurality of interconnected semiconductor subassemblies, each semiconductor subassembly comprising:
a wafer having first and second opposed metallized faces;
a semiconductor switching device electrically coupled to the first metallized face, wherein the semiconductor switching device includes a gate electrode region and a emitter electrode region; and
an interconnect bonded to the semiconductor switching device, and including
a first metal layer conductively bonded to the gate electrode region of the switching device,
a ceramic layer bonded to the first metal layer and defining a via for accessing the first metal layer,
a second metal layer bonded to the ceramic layer, and
a conducting substance disposed in the via of the ceramic layer to electrically couple the first metal layer to the second metal layer such that the second metal layer forms a contact pad for the gate electrode region of the semiconductor switching device, wherein the conducting substance is substantially spherical.

11. The semiconductor module of claim 10, wherein the second metal layer completely covers the conducting substance.

12. The semiconductor module of claim 10, wherein the second metal layer includes a portion that covers the spherical conducting substance and the via, the portion being depressed to contact the spherical conducting substance.

13. The semiconductor module of claim 10, wherein the ceramic layer has a first surface that defines a first area and the second metal layer has a first surface that defines a second area, the first area being approximately equal to the second area.

14. The semiconductor subassembly of claim 1, wherein the conducting substance comprises a first material and the second layer comprises a second material, different from the first material.

15. The semiconductor module of claim 10, wherein the conducting substance comprises a first material and the second layer comprises a second material, different from the first material.

16. The semiconductor subassembly of claim 1, wherein the first metal layer has a first coefficient of expansion and the second metal layer has a second coefficient of expansion, the first coefficient of expansion being approximately equal to the second coefficient of expansion.

17. The semiconductor subassembly of claim 1, wherein the first metal layer, the ceramic layer, and the second metal layer collectively have a first coefficient of expansion and the semiconductor switching device has a second coefficient of expansion, the first coefficient of expansion being approximately equal to the second coefficient of expansion.

* * * * *